US007002867B2

(12) United States Patent
Jain

(10) Patent No.: US 7,002,867 B2
(45) Date of Patent: Feb. 21, 2006

(54) REFRESH CONTROL CIRCUIT FOR ICS WITH A MEMORY ARRAY

(75) Inventor: Raj Kumar Jain, Singapore (SG)

(73) Assignee: Infineon Technologies Aktiengesellschaft, Munich (DE)

( * ) Notice: Subject to any disclaimer, the term of this patent is extended or adjusted under 35 U.S.C. 154(b) by 149 days.

(21) Appl. No.: 10/065,195

(22) Filed: Sep. 25, 2002

(65) Prior Publication Data

US 2004/0057315 A1 Mar. 25, 2004

(51) Int. Cl.
   *G11C 7/00* (2006.01)

(52) U.S. Cl. .................................. 365/222; 365/230.04
(58) Field of Classification Search ................. 265/222; 365/233, 230.02, 207, 230.04, 230.06, 230.05
   See application file for complete search history.

(56) References Cited

U.S. PATENT DOCUMENTS 5,923,593 A * 7/1999 Hsu et al. ............... 365/189.04
6,359,813 B1 * 3/2002 Uchida et al. .......... 365/189.05
6,445,638 B1 * 9/2002 Hsu et al. ............... 365/230.05
6,552,951 B1   4/2003 Raj et al.
2001/0012230 A1  8/2001 Takemae et al.
2001/0017791 A1 * 8/2001 Funyu et al. ........... 365/189.07
2002/0057617 A1  5/2002 Afghahi et al.

FOREIGN PATENT DOCUMENTS

WO   WO 00/19437   9/1999

OTHER PUBLICATIONS

Sakurai et al., "Transparent-Refresh DRAM (TReD) Using Dual-Port DRAM Cell", IEEE 1998 Custom Integrated Circuits Conference, May 16–19, 1998, p. 4.3.1–4.3.4, Rochester, New York.

* cited by examiner

*Primary Examiner*—Thong Q. Le
(74) *Attorney, Agent, or Firm*—Horizon IP Pte Ltd

(57) ABSTRACT

An IC having an array of memory cells that can be accessed through two different ports is described. Read/write operation is performed through one of the ports. The refresh of the memory cell is performed through the other port. In one embodiment, the other port is only used internally to the memory array.

38 Claims, 5 Drawing Sheets

REFRESH CONTROL CIRCUIT FOR ICS WITH A MEMORY ARRAY

BACKGROUND OF INVENTION

Integrated circuits can include an array of dynamic random access memory cells (DRAM). A DRAM cell includes a storage capacitor for storing a charge that represents, for example a logic "0" or "1". Since the charge stored within the cell capacitor leaks due to parasitic current paths, the charge has to be refreshed periodically. The time between two refresh events of the same memory cell is called retention time. The retention time is set such that the storage capacitor has always enough charge so that it can be detected by a sense amplifier. A refresh operation is usually performed for a complete row of memory cells within the memory cell array. During a refresh cycle, the information stored in the memory cells of a row is read out, amplified, and written back into the memory cells. The size of a memory cell of a DRAM is small so that dynamic memories provide for a high cell count on a single chip. A refresh operation, however, is time-consuming and slows down the operation of a DRAM.

From the foregoing discussion, it is desirable to provide a refresh scheme which reduces the adverse impact to performance.

SUMMARY OF INVENTION

The invention relates generally to ICs with a memory array of multi-port memory cells. More particularly, the invention relates to refreshing of multi-port memory cells. In one embodiment, the memory array comprises dual port memory cells. An external access to a particular memory cell is performed through one of the access ports. The other access port is not accessible by external signals and is hidden from the outside. The other port performs the refresh of the memory cell array. A particular memory cell is coupled to the first access port in order to read or write data signals. The memory cell is also coupled to the second port in order to be refreshed.

In one embodiment, the external interface of the memory device is comparable to a SRAM device. The interface of the memory device of the invention does not need a refresh that is initiated from memory external devices. However, since dynamic memory cells are used, a refresh operation is performed internally and is transparent to the environment of the system.

As an advantage of the invention, an SRAM functionality is achieved, although the internal structure of the memory device uses dynamic memory cells. The memory cells have two selection transistors which connect the storage node of the cell to the first and second ports. The read and write operations from the exterior are performed through one of the ports. A refreshing is performed through the other port of the memory cell.

Special arrangements are provided to hide the internal refresh operation from the outside environment. In particular, a contention detection monitors if a read/write access and a refresh operation are subject to a particular row of memory cells. If the row address of a read/write access and the row address of a refresh operation are the same, the refresh operation is suppressed for this particular row and the read/write access is preferred over the refresh operation. During the read/write access to a memory cell, the row within which the memory cell is located is inherently refreshed. In case of a contention, it is possible to keep the refresh operation idle or, alternatively, to simply skip the refresh for the row of the read/write access and perform the refresh operation for the next row within the same cycle.

Another aspect of the invention is the generation of the refresh address clock signal which operates the refresh address counter. In the normal operation mode of the memory device, a clock signal is provided to one of the input terminals of the memory device. Usually, data signals are provided in synchronism with the system clock signal. During power-down mode, the clock signal may be absent in order to save power. The refresh operation during the power-down mode is switched to a reference clock signal which is usually also provided to the memory device. The reference clock may be generated by a quartz oscillator. The quartz oscillator frequency can be considerably lower than the frequency of the system clock. The refresh control circuit has suitable devices to synchronize the refresh operation with the system clock or with the reference clock depending on whether the normal operation mode or the power-down mode is operative.

The memory device may have separate sense amplifiers for the data read/write operations and the refresh operations. The sense amplifiers for read/write operations are connected to the first port of a memory cell and are connected to the peripheral data input/output circuits. The read/write sense amplifiers are connected to a column decoder that is able to select at least one of the sense amplifiers in response to a column address signal so that a data path is established to the peripheral input/output circuitry. The refresh sense amplifiers are activated altogether so that a row of memory cells can be refreshed at a time.

The particular timing of a number of signals that control the sequence of a refresh operation is generated by a finite state machine and is distributed to the memory cell array and to the refresh row decoder.

The refresh addresses generated by the refresh control circuit may be provided to different memory blocks in parallel. A selection between the different blocks is made through a particular bit of a refresh enable signal that enables the refresh within one of the blocks at a time. Preferably, the blocks are activated for a refresh, one after the other so that a continuous address space of row addresses to be refreshed is achieved.

DETAILED DESCRIPTION

Figure 1:
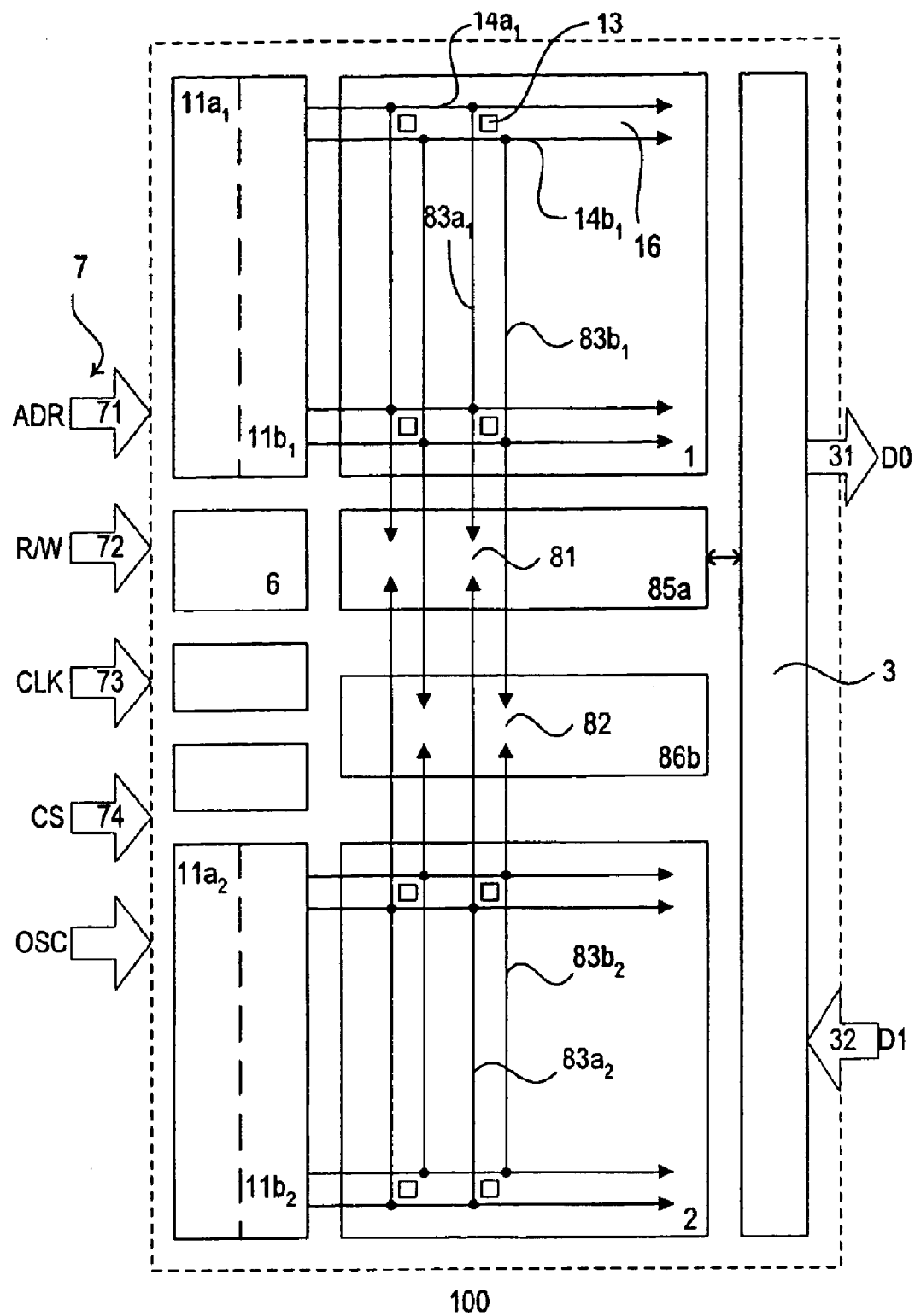
FIG. 1 shows a block diagram of a memory array in accordance with one embodiment of the invention.

FIG. 1 shows a block diagram of an array 100 of memory cells 13 in accordance with one embodiment of the invention. The array can be part of an IC, such as a system-on-chip (SOC). Other types of ICs, such as memory ICs, are also useful. The array includes a bank of memory cells. The memory cells are interconnected by bitlines 83 in the column direction 15 and wordlines 14 in the row direction 16. The bitlines are coupled to sense amplifiers 85 to facilitate memory accesses. First and second bitlines are coupled to a sense amplifier to form a bitline pair. The memory array can be provided with more than one bank. Preferably, for multiple bank arrays, the number of banks is equal to $2^n$, where n is a whole number. Other number of banks is also useful.

In one embodiment, the bank is separated into first and second blocks 1 and 2, each with a plurality of memory cells interconnected by bitlines 83 in the column direction and wordlines 14 in the row direction. The memory cells are arranged in an open bitline architecture. In an open bitline architecture, one bitline from each block is coupled to the same sense amplifier. Other memory architectures, such as folded bitline, are also useful. For example, the bitlines of a bitline pair are adjacent to each other in a folded bitline architecture. In one embodiment, the memory array comprises dual port memory cells. A memory cell is coupled to first and second bitlines and first and second wordlines. As such a row of memory cells are coupled to first and second wordlines 14a–b and a column of memory cells is coupled to first and second bitlines 83a–b. Alternatively, the memory array comprises memory cells with more than two ports.

The first and second wordlines are coupled to first and second row decoders 11a–b. In one embodiment, the wordlines of the first block are coupled to first and second row decoders $11a_1$ and $11b_1$ and the wordlines of the second block are coupled to first and second row decoders $11a_2$ and $11b_2$. Although the first and second wordline decoders are depicted as separate adjacent decoders, it is understood that decoders can be a plurality of segments in which alternating segments are from respective first and second decoders. This configuration advantageously allows the decoder segments to be aligned to respective wordlines. A first wordline is activated through the first row decoder and a second wordline is activated through the row decoder.

First and second sense amplifier banks 85a–b having a plurality of sense amplifiers are coupled to first and second bitlines to facilitate memory accesses. The first bitlines of the memory cells are coupled to first sense amplifier bank while the second bitlines of the memory cells are coupled to the second sense amplifier bank.

A sense amplifier is coupled to two first or two second bitlines of the memory cells to form a bitline pair. A memory cell is selected from one of the bitline pair (selected bitline) while the other bitline serves as a reference bitline. In one embodiment, the memory array is arranged in an open bitline architecture. In an open bitline architecture, the bitlines of a bitline pairs are in different memory blocks. For example, a sense amplifier is coupled to a first bitline from the first block and a first bitline from the second block. Providing a memory array arranged in other types of bitline architectures, such as open or open-folded, is also useful.

In one embodiment, the first port of the memory cells serves as access port and the second port serves as refresh port. The refresh operations are completely internal to the memory array. By providing a dedicated refresh port, the memory array can achieve SRAM functionality on the system level while using dynamic memory cells for information storage. Since multi-port DRAM cells are smaller in size than SRAM cells, their use advantageously results in reduced chip size.

To perform a memory access, such as a read/write access, appropriate external signals are provided through respective control input terminals 7. For example, the first row decoder is operated in response to an address signal ADR on signal line 71, a read/write signal R/W on signal line 72, and a chip select signal CS on signal line 74. For a synchronous memory system, a system clock signal CLK can be provided on signal line 73. Alternatively, no CLK signal is needed for asynchronous systems. The memory cell corresponding to the ADR is accessed. In one embodiment, an alternative OSC clock signal for example, from an oscillator, can be provided on signal line 75.

For a read access, the information stored in the accessed memory cell is made available on the first bitline and is sensed in sense amplifier of the first sense amplifier bank. An output of the sense amplifier is selected through a column decoder so that the output signal of the sense amplifier is forwarded to peripheral circuitry 3 which drives the data onto output signal terminal 31. For a write operation, a data-in signal is applied to input terminal 32 and is distributed through the data path back to the selected memory cell. The sense amplifier is also connected to first bitline in second memory cell block, which functions as a reference bitline. Although the input and output terminals are depicted as separate terminals, it is understood that a single bi-directional terminal can be provided instead.

The charge stored in the memory cells of the array dissipates over time and needs to be refreshed in order to maintain the data stored. In one embodiment, a refresh operation refreshes a row of memory cells simultaneously. To perform a refresh to a row, the second or refresh row decoder activates the refresh wordline of the row to be refreshed. For example, a row in the first block is refreshed. The information stored in memory cells of the row are read, sensed by the second or refresh amplifier banks, and written back into the memory cells of the refreshed row. The second bitlines of the second block serves as reference refresh bitlines for the sense amplifier bank.

Figure 2:
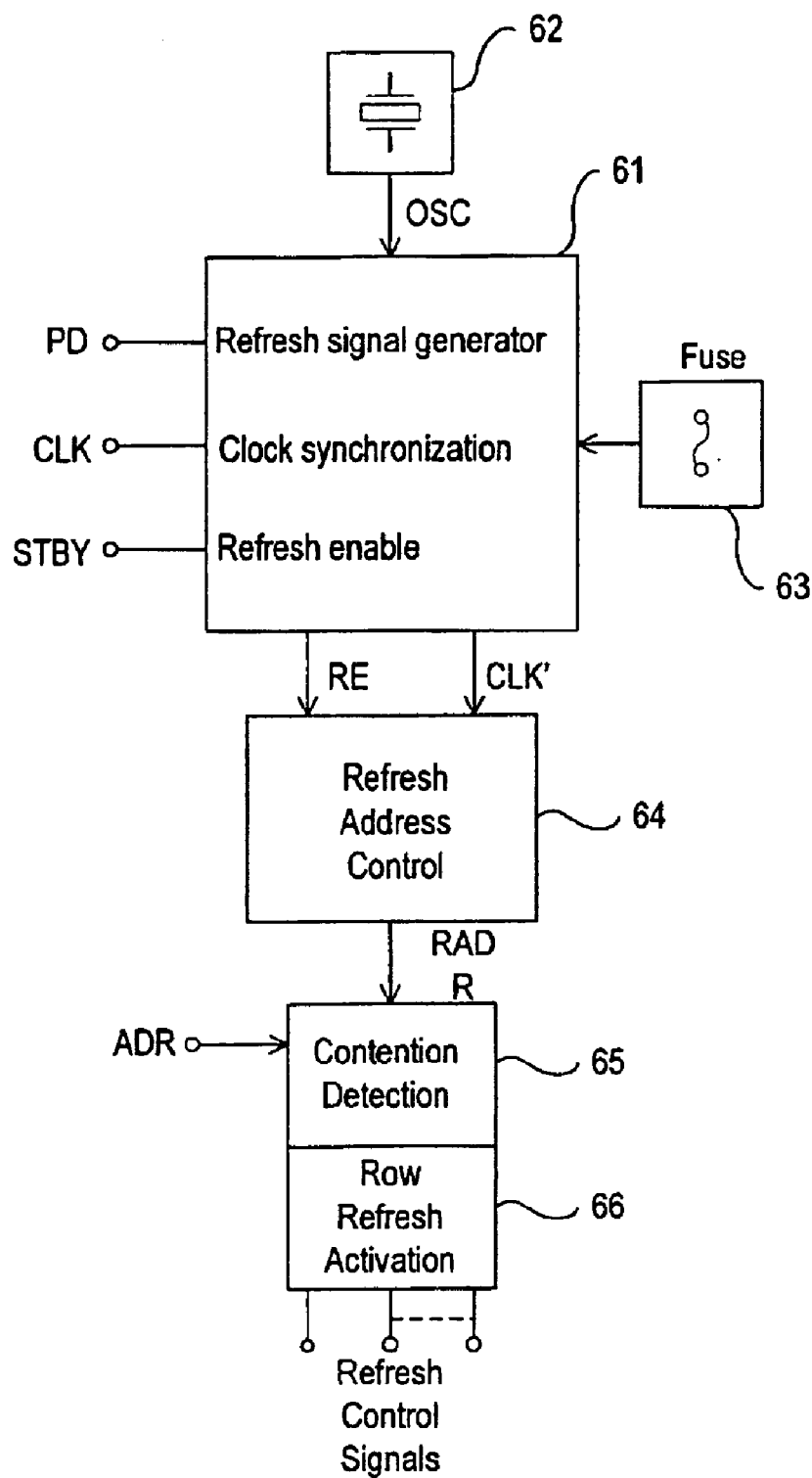
FIG. 2 shows a functional block diagram of a refresh control circuit in accordance with one embodiment of the invention.

The control signals for performing a refresh operation is generated by a refresh control circuit 6. The refresh operation in accordance with one embodiment of the invention is described in conjunction with FIGS. 2–3. A refresh enable signal RE indicates the activation of a refresh operation. The time between two successive refresh cycles is referred to as the retention time R. The retention time R may be In this case, the retention time can be set after the production of the memory chip during test measurements which determine the amount of leakage in order to fine-tune the setting of the retention time. The set values for the retention time can be permanently programmed by, for example, fuses 63. Also the control of the retention time can be designed to be dynamic through a reference discharge path in, for example, the array. When the charge that passes through the discharge path exceeds a threshold value, a refresh enable pulse RE is activated. In one embodiment, the discharge path comprises a reference memory cell having a similar design as the memory cells of the array. Other techniques for determining the retention time are also useful.

The addresses RADR of the rows of the memory cells to be refreshed are generated by refresh address counter 64. The clock signal CLK' provides the counting pulse for refresh address counter 64. The refresh address counter 64 is enabled by the refresh enable signal RE. In one embodiment, the refresh counter counts the cycles based on the system clock CLK (e.g., refresh controlled by CLK signal). In an alternative embodiment when the system clock is disabled during power-down mode (e.g., power-down signal PD=1), an oscillator clock OSC is provided by a reference oscillator, preferably a quartz oscillator 62, controls the refresh address counter 64. The quartz oscillator clock OSC, in one embodiment, has a much lower frequency than the system clock CLK and may include a phase shift compared to the system clock CLK. The switching from normal operation to power down mode (PD=1) or vice-from power down mode to normal operation (PD=0) can occur during a refresh period (RE=1). In this case, the refresh clock CLK' should be synchronized either to the system clock CLK or to the quartz oscillator clock OSC in order to ensure that the refresh operation is completed without error. If synchronization of the refresh address counter clock CLK' to the clock sources CLK or OSC could not be achieved, a particular row of memory cells would be skipped during refresh and the stored information may be destroyed.

During a standby mode (STBY=1), the IC is fully shut down, and it is not desired to maintain the storage of information. During standby of the IC, the refresh signal generation is stopped.

In one embodiment, all the above functionality, including refresh signal generation, clock synchronization, and refresh enabling, is provided by the refresh control circuit 6, in particular in portion 61 of the refresh control circuit 6.

Figure 3:
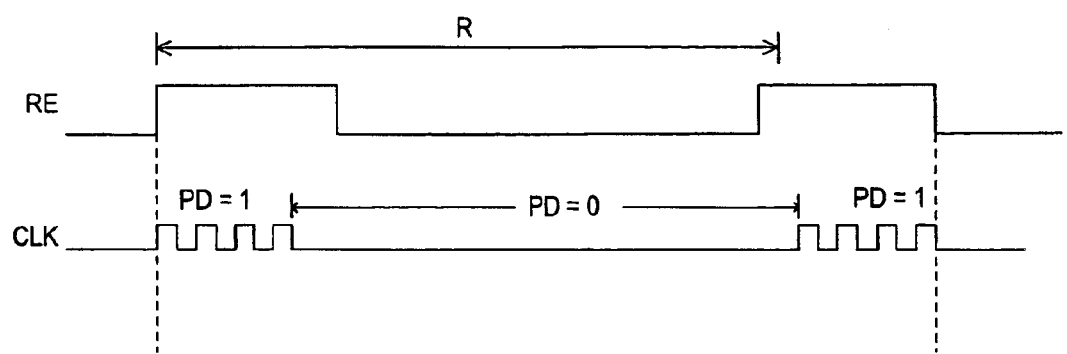
FIG. 3 shows the timing of clock signals and the refresh enable signal which control a refresh operation in accordance with one embodiment of the invention.

The refresh enable signal can be provided as one continuous active impulse and an idle portion as shown in FIG. 3, alternatively, the active pulses of the refresh enable signal are shorter and are distributed preferably equally over the retention time interval. The periodicy of the active pulses equals the retention time. During the retention time interval R all the memory cells need to be refreshed. For example, when N rows of the memory device are to be refreshed, there are N active pulses of the refresh enable signal, preferably at equidistant time instances distributed over the retention time period R.

The refresh address RADR indicates the row of memory cells on which the refresh operation is currently performed. For example, the refresh address row decoder 12 activates wordline 14b of row 16 so that the charge stored in the memory cells of row 16 are output in parallel to the refresh amplifiers in amplifier bank 86. The amplifiers in bank 86 amplify the small signals received from row 16. After sufficient amplification, the amplified signals are written back into the memory cells of row 16 and the wordline 14b is disabled. When at the same time or within the same clock cycle a read/write access is requested through an address ADR supplied to the external address lines 71, a contention detection and handling takes place in function block 65 of refresh control circuit 6. In this case when the row portion of the external address ADR and the refresh address RADR are the same, the refresh for the particular row of memory cells, (e.g., row 16) is suppressed and a data read or a data write depending on the state of the read/write signal R/W is performed. The refresh operation can be idle or the refresh can be performed on a different row, preferably the next row having an address which is incremented by one. It is also possible to refresh another row of memory cells, alternatively. This scheme of contention detection is possible due to the fact that when a piece of information is read out or written into one of the memory cells of a row, (e.g., memory cell 13 of row 16), the contents of all memory cells of the particular row are output onto the bitlines that are connected to the sense amplifiers of amplifier bank 85. Comparable to a refresh operation, the signals are amplified by the amplifiers of bank 85 and, even during a read cycle, are written back into the respective memory cells.

In one embodiment, the particular sequencing of signals performing a refresh operation on a particular row is performed by a finite state machine 66. The refresh control signals on signal lines include, for example, precharge control, decoder select, selection of n-channel-transistor sense amplifier portion, and p-channel-transistor sense amplifier portion. Another sequencing of control signals is also useful. The sequencing of the control signals can be in-phase to the clock signal or out-of-phase to the clock signal. The contention detection has to be adopted correspondingly. The respective refresh control signals present on signal lines are propagated over suitable signal paths to the appropriate circuit elements in the memory device of FIG. 1 in order to perform the refresh operation as explained above.

As shown in FIG. 1, the memory cell array comprises a bank which is divided into two different blocks. The first and second blocks are arranged in an open bitline architecture. Arranging the bank with other types of bitline architectures, such as folded, is also useful. Providing an array with multiple banks is also useful.

Figure 4:
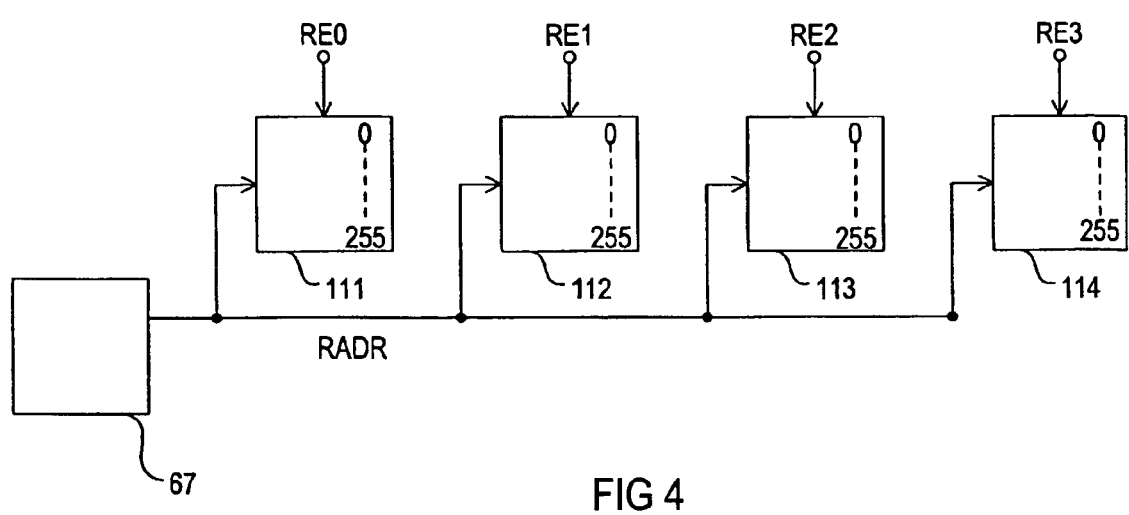
FIG. 4 shows a memory array in accordance with an alternative embodiment of the invention.

Illustratively, as shown in FIG. 4, the array can be organized into four banks 111, 112, 113, 114 of memory cells, each bank having n rows of memory cells. For example, n is equal to 256. Providing n equal to other values can also be useful. Preferably, n is equal to $2^x$, where x is a whole number. The memory cells of a bank can be arranged in an open-bitline architecture. Other types of architectures, such as folded, are also useful.

The refresh addresses RADR generated in refresh control block 67 are provided to all banks 111–114 in parallel. The refresh operation within one of the banks, in one embodiment, is enabled by a different refresh enable signal RE0, RE1, RE2, and RE3, respectively. In one embodiment, only one of the refresh enable signal is activated at a time. Alternatively, all or some of the refresh enable signals are activated at the same time. This can be facilitated by, for example, providing all or some common refresh enable signals. Refreshing more than one bank at a time increases refresh performance. The increase in performance, however, requires more peak power. The refresh, in one embodiment, is selected to optimize performance and power requirements.

Figure 5:
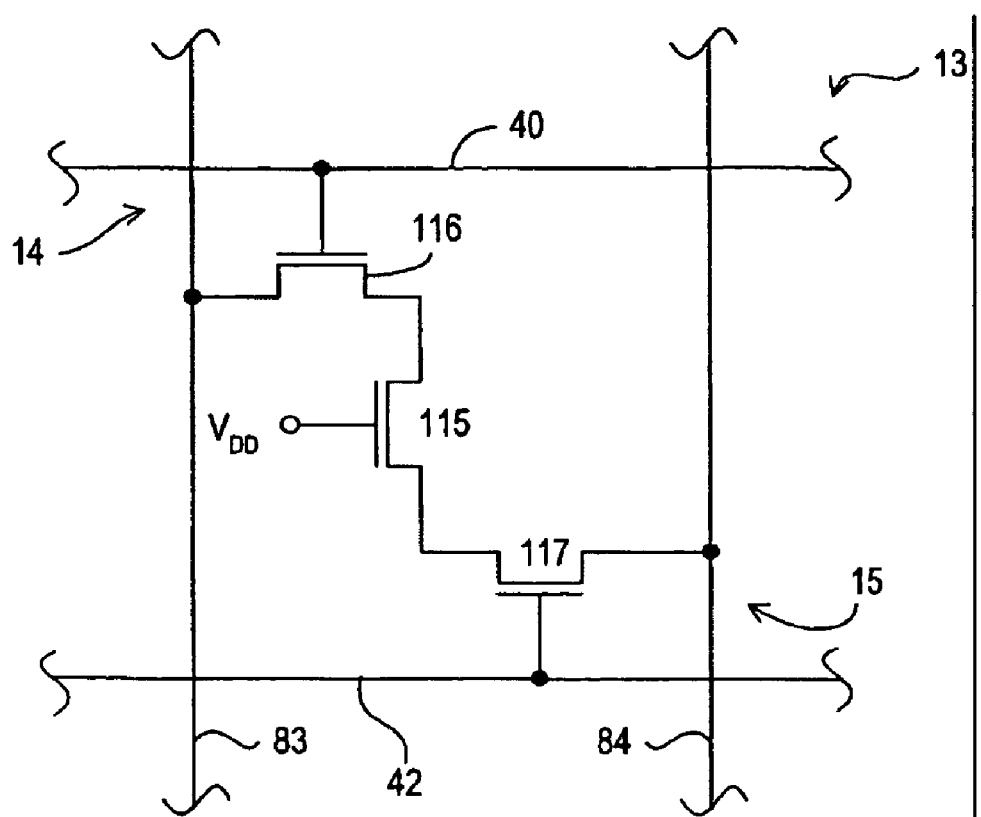
FIG. 5 shows a memory cell in accordance with one embodiment of the invention.

FIG. 5 shows a dual port memory cell in accordance with one embodiment of the invention. The memory cell comprises a storage transistor 115. The gate electrode of the storage transistor 115 is connected to a reference potential, e.g., the positive power supply $V_{DD}$. One end of the drain source path of storage transistor 15 is connected to a selection transistor 116, the gate of which being connected to 40 and another end of its drain source path being connected to bitline 83. The other end of the drain source path of storage transistor 115 is connected to a second selection transistor 117, the gate of which being connected to wordline 42 and another end of its drain source path being connected to bitline 84. In one embodiment, all transistors of the memory cell are n-FETs. Providing p-FETS or a combination of n-type and p-type FETs is also useful. Alternatively, the storage transistor 115 can be replaced by a storage capacitor. Other types of multi-port memory cells are also useful.

The invention has been particularly shown and explained in conjunction with various useful or alternative embodiments. It will be recognized by those skilled in the art that modifications and changes may be made to the present invention without departing from the spirit and the scope thereof. The scope of the invention should therefore be determined not with reference of the above description of the embodiment, but with reference to the appended claims along with their full scope, including any equivalents.

What is claimed is:

1. A memory device comprising:
    a plurality of memory cells, each memory cell includes first and second ports forming a memory array with first and second access ports, wherein the first access port is an external port for read and write memory accesses and the second access port is an internal port for refresh operations;
    a refresh control unit generating refresh control signals to control refreshing of the memory cells; and
    a contention detection circuit, the contention detection circuit, when a memory access via the external port and a refresh operation via the internal port occur, compares an access row address of the memory access with a refresh row address of the refresh operation and suppressing the refresh operation if the access address and the refresh row address are equal.

2. A memory device comprising:
    a memory cell array having a multitude of memory cells, first and second bitlines, and first and second wordlines, each of said memory cells being coupled to one of said first bitlines, one of said second bitlines, one of said first wordlines, and one of said second wordlines;
    each of said memory cells being accessible through one of said first wordlines and one of said first bitlines by an external port and being accessible through one of said second wordlines and one of said second bitlines by an internal port;
    said external port being connected to input terminals to receive input signals in order to select one of said memory cells for an external data access;
    a refresh control unit generating refresh control signals to control refreshing of the memory cells through said internal port;
    a contention detection circuit, said contention detection circuit receiving a row address in response to an external read or write access through said external port and receiving a refresh address for a row of memory cells to be refreshed, said contention detection circuit suppressing a refresh, if said refresh address equals said row address; and
    wherein each one of said memory cells comprises
    a first selection transistor coupled to one of said first wordlines and one of said first bitlines,
    a second selection transistor coupled to one said second wordlines and one of said second bitlines, and
    a storage node connected to said first selection transistor and said second selection transistor.

3. The memory device according to claim 2 wherein each one of said memory cells comprises:
    a storage transistor having a drain/source path and a gate terminal, said drain/source path being connected to said first and said second selection transistors; and
    said gate terminal being connected to a reference potential.

4. The memory device according to claim 2 wherein said external port is connected to input terminals designed to receive one of an address signal, a signal determining a read or a write operation, a data clock signal, and a device select signal.

5. The memory device according to claim 4 wherein said internal port is hidden from said address signal, said signal determining a read or a write operation, and said device select signal.

6. The memory device according to claim 2 comprising:
    a first bank of sense amplifiers, wherein each one of said first bitlines is connected to one of said sense amplifiers of said first bank;
    a column decoder, wherein an individual one of said sense amplifiers of said first bank can be selected to perform one of data read to an external terminal; and
    data write from an external terminal.

7. The memory device according to claim 6 comprising:
    a second bank of sense amplifiers, wherein each one of said second bitlines is connected to one of said sense amplifiers of said second bank, and wherein multiple of said amplifiers are selected to perform a refresh of a row of memory cells.

8. The memory device according to claim 2 comprising:
    a first clock terminal to receive a system clock signal to synchronize external data input and output;
    a second clock terminal to receive a reference clock signal; and
    a synchronization circuit to output a refresh clock signal which is synchronized to one of said system clock or said reference clock signals.

9. The memory device according to claim 8 comprising:
    a refresh address counter to generate row addresses of rows of memory cells to be refreshed, said address counter being controlled by said refresh clock.

10. The memory device according to claim 8 wherein said memory cell array comprises at least two blocks of memory cells, said blocks being provided with a refresh row address in parallel, said refresh control circuit generating a separate refresh enable signal for each of said blocks to perform a refresh operation for one of said blocks subsequent to a refresh operation for another one of said blocks.

11. A memory device comprising:
    a memory cell array having memory cells, each of said memory cells being accessible through a first port and through a second port, only said first port of said first and second ports being accessible by an external address signal to select one of said memory cells; and
    a refresh control circuit designed to generate refresh control signals to refresh said memory cells through said second port, wherein said refresh control circuit receives a system clock signal and a reference clock signal, said refresh control circuit has a refresh address counter to provide a sequence of addresses for subsets of memory cells to be refreshed, said memory device having a normal mode and a power-down mode, wherein said refresh address counter is controlled by said system clock signal during the normal mode and is controlled by said reference clock signal during the power-down mode; and
    a contention detection circuit receiving an internal or refresh address to access a subset of said memory cells for a refresh operation and an external address to access at least of one said memory cells for a read or write operation, said contention detection circuit suppressing a refresh operation for said subset of said memory cells if the external address accesses a memory cell within the subset of memory cells of the refresh address.

12. The memory device according to claim 11 wherein a refresh operation is performed for another subset of memory cells.

13. The memory device according to claim 11 wherein said subset of memory cells is a row of memory cells.

14. The memory device according to claim 11 wherein said refresh control circuit receives a system clock signal and a reference clock signal, said refresh control circuit has a refresh address counter to provide a sequence of addresses for subsets of memory cells to be refreshed, said memory device having a normal mode and a power-down mode, wherein said refresh address counter is controlled by said system clock signal during the normal mode and is controlled by said reference clock signal during the power-down mode.

15. The memory device according to claim 11 wherein said refresh control circuit comprises a synchronization circuit that synchronizes a clock signal to one of said system clock or reference clock signals in response to one of said normal or power-down modes, wherein said clock signal controls said refresh address counter.

16. The memory device according to claim 11 wherein said reference clock signal has a lower frequency than said system clock signal.

17. The memory device according to claim 11 wherein each one of said memory cells comprises:
a first selection transistor coupled to one of said first wordlines and one of said first bitlines and a second selection transistor coupled to one said second wordlines and one of said second bitlines; and
a storage node connected to said first selection transistor and said second selection transistor.

18. The memory device of claim 11 wherein:
the memory cells are arranged in rows;
a first row decoder to activate one of said rows in response to the external address; and
a second row decoder to activate one of said rows in response to an internal address generated by the refresh control circuit.

19. The memory device according to claim 18 wherein each one of said memory cells comprises a first selection transistor connected to the first row decoder through a first wordline and a second selection transistor connected to the second row decoder through another wordline and a storage node coupled to the first and the second selection transistors.

20. An integrated circuit (IC) comprising:
a multi-port memory cell array having at least first and second ports;
a plurality of memory cells accessible by the first and second ports;
a refresh control unit generating refresh control signals to control refreshing of the memory cells; and
a contention detection circuit to for detecting contention between a refresh operation from one of the ports and a read or write memory access operation from other of the ports and suppressing the refresh operation when contention occurs to allow the read or write memory access to execute.

21. The IC of claim 20 wherein the first port comprises an internal access port for performing refreshing of the memory cells and the second port comprises an external port for performing read and write memory access operations.

22. The IC of claim 21 wherein:
refresh control signals include a refresh address indicating location of a subgroup of memory cells of the array to be refreshed address for refreshing a subgroup of memory cells of the array; and
the contention suppressing refreshing operation when the memory access operation accesses a memory cell within the subgroup of memory cells to be refreshed.

23. The IC of claim 22 wherein the subgroup of memory cells comprises at least one row of memory cells.

24. The IC of claim 22 wherein the subgroup of memory cells comprises a row of memory cells.

25. The IC of claim 20 wherein:
refresh control signals include a refresh address indicating location of a subgroup of memory cells of the array to be refreshed address for refreshing a subgroup of memory cells of the array; and
the contention suppressing refreshing operation when the memory access operation accesses a memory cell within the subgroup of memory cells to be refreshed.

26. The IC of claim 25 wherein the subgroup of memory cells comprises at least one row of memory cells.

27. The IC of claim 20 wherein the refresh control circuit comprises a refresh address counter in the refresh control circuit for generating refresh control signals corresponding address of memory cells to be refreshed.

28. The IC of claim 27 wherein the address of memory cells to be refreshed comprises the address of a row of memory cells to be refreshed.

29. The IC of claim 20 wherein a system clock signal and a reference clock signal are provided to the refresh control circuit, the system clock signal controls the refresh address counter when the memory array is operating in a normal mode of operation and the reference clock signal controls the refresh address counter when the memory array is in a power-down or reduced power mode of operation.

30. The IC of claim 29 wherein the reference clock signal has a lower frequency than the system clock signal.

31. The IC of claim 29 wherein the refresh control circuit comprises a synchronization circuit that synchronizes a clock signal to one of the system or reference clock signals depending on the mode of operation of the memory array.

32. The IC of claim 31 wherein the reference clock signal has a lower frequency than the system clock signal.

33. The IC of claim 20 wherein a system clock signal and a reference clock signal are provided to the refresh control circuit, the system clock signal controls the refresh address counter when the memory array is operating in a normal mode of operation and the reference clock signal controls the refresh address counter when the memory array is in a power-down or reduced power mode of operation.

34. The IC of claim 33 wherein the reference clock signal has a lower frequency than the system clock signal.

35. The IC of claim 33 wherein the refresh control circuit comprises a synchronization circuit that synchronizes a clock signal to one of the system or reference clock signals depending on the mode of operation of the memory array.

36. The IC of claim 35 wherein the reference clock signal has a lower frequency than the system clock signal.

37. An IC comprising:
a plurality of memory cells forming a memory array arranged in rows and columns;
a refresh control unit generating refresh control signals to control refreshing of the memory cells; and
a contention detection circuit, when a read or write memory access and a refresh operation are to the same row, suppresses the refresh operation to enable execution of the read or write memory access.

38. The IC of claim 37 wherein the memory cells comprise first and second ports, wherein the read or write memory access is to one of the first and second ports and the refresh operation is to other of the first and second ports.

* * * * *